(12) United States Patent
Liu

(10) Patent No.: US 12,604,566 B2
(45) Date of Patent: Apr. 14, 2026

(54) LED STRUCTURE AND MANUFACTURING METHOD THEREOF, AND LED DEVICE

(71) Applicant: Enkris Semiconductor (Wuxi), Ltd., Wuxi (CN)

(72) Inventor: Weihua Liu, Wuxi (CN)

(73) Assignee: Enkris Semiconductor (Wuxi), Ltd., Wuxi (CN)

( * ) Notice: Subject to any disclaimer, the term of this patent is extended or adjusted under 35 U.S.C. 154(b) by 570 days.

(21) Appl. No.: 18/166,885

(22) Filed: Feb. 9, 2023

(65) Prior Publication Data

US 2023/0282768 A1     Sep. 7, 2023

(30) Foreign Application Priority Data

Mar. 2, 2022    (CN) .......................... 202210204271.3

(51) Int. Cl.
*H10H 20/815*       (2025.01)
*H10H 20/01*       (2025.01)
*H10H 20/80*       (2025.01)
*H10H 20/811*       (2025.01)
*H10H 20/825*       (2025.01)
*H10H 20/851*       (2025.01)
*H10H 20/854*       (2025.01)

(52) U.S. Cl.
CPC .... *H10H 20/815* (2025.01); *H10H 20/01335* (2025.01); *H10H 20/811* (2025.01); *H10H 20/825* (2025.01); *H10H 20/8516* (2025.01); *H10H 20/854* (2025.01); *H10H 20/872* (2025.01)

(58) Field of Classification Search
CPC ........... H10H 20/815; H10H 20/01335; H10H 20/811; H10H 20/825; H10H 20/8516; H10H 20/854; H10H 20/872; H10H 20/01; H10H 20/813
See application file for complete search history.

(56) References Cited

U.S. PATENT DOCUMENTS

| | | | |
|---|---|---|---|
| 10,411,159 B2* | 9/2019 | Lai .......................... | H01L 21/78 |
| 2020/0185652 A1* | 6/2020 | Sun ..................... | H10K 59/879 |
| 2022/0199722 A1* | 6/2022 | Fang ................... | H10K 59/878 |
| 2023/0238474 A1* | 7/2023 | Cheng ................. | H01L 25/0753 |
| | | | 438/29 |
| 2023/0282685 A1* | 9/2023 | Liu ...................... | H10H 29/142 |
| | | | 257/89 |
| 2023/0299118 A1* | 9/2023 | Cheng ................... | H10H 20/84 |
| | | | 257/88 |
| 2024/0222416 A1* | 7/2024 | Krames ............... | H01L 21/0254 |

* cited by examiner

*Primary Examiner* — Mark W Tornow
(74) *Attorney, Agent, or Firm* — Westbridge IP LLC

(57) ABSTRACT

Disclosed are an LED structure, an LED device and a manufacturing method for the LED structure. The LED structure includes a substrate structure including a substrate and a plurality of first stress modulation layers located on the substrate periodically and separately; and a light-emitting unit located on the substrate structure; wherein the substrate structure includes a first region of which upper surface is the first stress modulation layer and a second region of which upper surface is the substrate, and a light-emitting unit located on the first region and a light-emitting unit located on the second region have different light-emitting wavelengths, which realizes a light-emitting unit with two kinds of main light-emitting wavelengths on the same substrate.

20 Claims, 5 Drawing Sheets

10

10

LED STRUCTURE AND MANUFACTURING METHOD THEREOF, AND LED DEVICE

CROSS-REFERENCE TO RELATED APPLICATIONS

This application claims priority to Chinese Patent Application No. 202210204271.3, filed on Mar. 2, 2022, which is hereby incorporated by reference in its entirety.

TECHNICAL FIELD

The present disclosure relates to the field of light-emitting diode (LED) technology, in particular to an LED structure, an LED device and a manufacturing method for the LED structure.

BACKGROUND

At present, the mainstream technology of LED backlight is to realize white LED by combining a blue light LED and phosphor.

Usually, the traditional methods for implementation of combining a blue light LED and phosphor include the following:

(1) A white light LED is realized by combining a blue light LED and yellow light phosphor. An LED backlight chip produced by this method has a problem of low color gamut, resulting in low color fidelity of the display device;

(2) A white light LED with higher color gamut performance can be realized by combining a blue light LED and green light phosphor and red light phosphor. However, the efficiency of blue light LED to trigger green light phosphor is low, and the production cost of green light phosphor is high.

Therefore, in order to solve a technical problem of the low color gamut of the LED backlight chip, it is urgent to provide a new LED structure.

SUMMARY

The purpose of the present disclosure is to provide an LED structure, an LED device and a manufacturing method for the LED structure, so as to solve a problem of low color gamut of LED backlight chips.

According to one aspect of the present disclosure, an LED structure is provided. The LED structure includes a substrate structure and a light-emitting unit.

The substrate structure includes a substrate and a plurality of first stress modulation layers located on the substrate, the plurality of first stress modulation layers are arranged periodically.

The light-emitting unit is located on the substrate structure, and the light-emitting unit includes a first semiconductor layer, a light-emitting layer and a second semiconductor layer which are stacked in sequence.

The substrate structure includes a first region and a second region, the first stress modulation layer is located on the first region, a light-emitting unit located on the first region and a light-emitting unit located on the second region have different light-emitting wavelengths.

Further, the first stress modulation layer is a Group III-V compound, and a lattice constant of the first stress modulation layer is smaller than a lattice constant of the light-emitting unit.

Further, the light-emitting unit includes In element, and a content of In in the light-emitting unit located on the first region is smaller than a content of In in the light-emitting unit located on the second region.

Further, an insertion layer is provided in the first semiconductor layer, and the insertion layer is of the same conductivity-type as the first semiconductor layer.

Further, the LED structure further includes a second stress modulation layer, and the second stress modulation layer is located between the first semiconductor layer and the light-emitting layer.

Furthermore, the second stress modulation layer has a superlattice structure including a Group III-V compound material.

Further, a thickness of the first stress modulation layer is less than 30 nm.

Further, the LED structure further includes a buffer layer, and the buffer layer is located between the substrate structure and the light-emitting unit.

Further, the LED structure further includes a first electrode electrically connected to the first semiconductor layer; and a second electrode electrically connected to the second semiconductor layer.

Further, the first region and the second region are arranged periodically.

According to another aspect of the present disclosure, an LED device is also provided. The LED device includes an LED structure according to any one of the above-mentioned LED structures; an encapsulation substrate located on a side of the substrate structure away from the light-emitting unit; and an encapsulation adhesive covering an upper surface and a side wall of the LED structure. The encapsulation adhesive includes a phosphor material.

Further, a width of the LED structure is less than 100 μm.

Further, a width of the first stress modulation layer is less than 50 μm.

On the one hand, the LED structure of the embodiment according to the present disclosure realizes a light-emitting unit having two kinds of main light-emitting wavelengths on the same substrate. On the other hand, the LED device according to the embodiment in the present disclosure provides an LED backlight chip prepared by encapsulating a light-emitting unit having two kinds of main light-emitting wavelengths at the same time on the same substrate and phosphor powders of different wavelengths, which effectively solves the problem of low color gamut of traditional LED backlight chip, simplifies manufacturing steps of the LED backlight chip, and reduces manufacturing cost of the LED backlight chip.

DETAILED DESCRIPTION OF THE EMBODIMENTS

Exemplary embodiments will be described in detail herein, and examples of which are illustrated in the accompanying drawings. When the following description refers to the drawings, the same numerals in different drawings refer to the same or similar elements unless otherwise indicated. The implementations described in the following exemplary embodiments are not intended to represent all implementations consistent with this disclosure. Rather, they are merely examples of means consistent with some aspects of the present disclosure as recited in the appended claims.

The terms used in this disclosure are for the purpose of describing particular embodiments only and are not intended to limit the disclosure. Unless otherwise defined, technical or scientific terms used in this disclosure shall be understood as ordinary meaning to those of ordinary skill in the art to which this disclosure belongs. The terms "first", "second" and similar words used in the description and claims of this disclosure do not denote any order, quantity or importance, but are only used to distinguish different components. Likewise, "a/an" or "one" and the like do not denote a quantitative limitation, but rather denote the presence of at least one. "a plurality of" or "several" denote two or more. Unless otherwise indicated, terms such as "front", "rear", "lower part" and/or "upper part" are for convenience of description and are not limited to one location or one spatial orientation. Terms such as like "comprise" or "include", and the like are intended to denote that elements or objects appearing before "comprise" or "include" encompass the elements or objects or any equivalent thereof listed after "comprise" or "include", but do not exclude other elements or objects. Terms "connect" or "contact" and similar words are not limited to physical or mechanical connections, but may include electrical connections, whether direct or indirect. As used in this specification and the appended claims, the singular forms "a," "the," and "said" are intended to include the plural forms as well, unless the context clearly dictates otherwise. It will also be understood that the term "and/or" as used herein refers to and includes any or all of possible combinations of one or more of the associated listed items.

The First Embodiment

Figure 1:
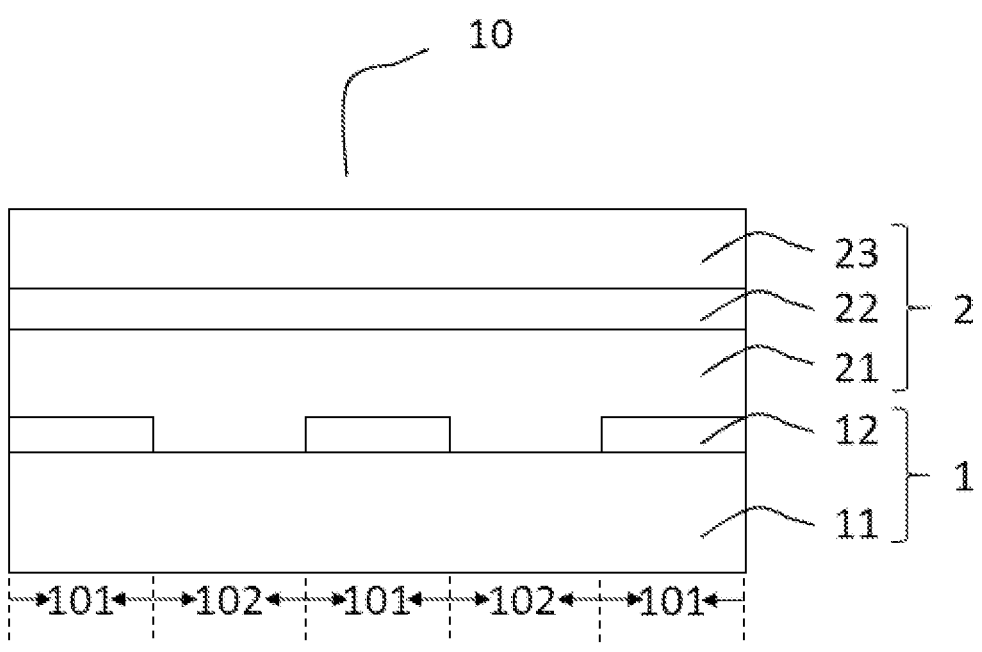
FIG. 1 is a schematic structural diagram according to a first embodiment of the present disclosure.
Figure 7:
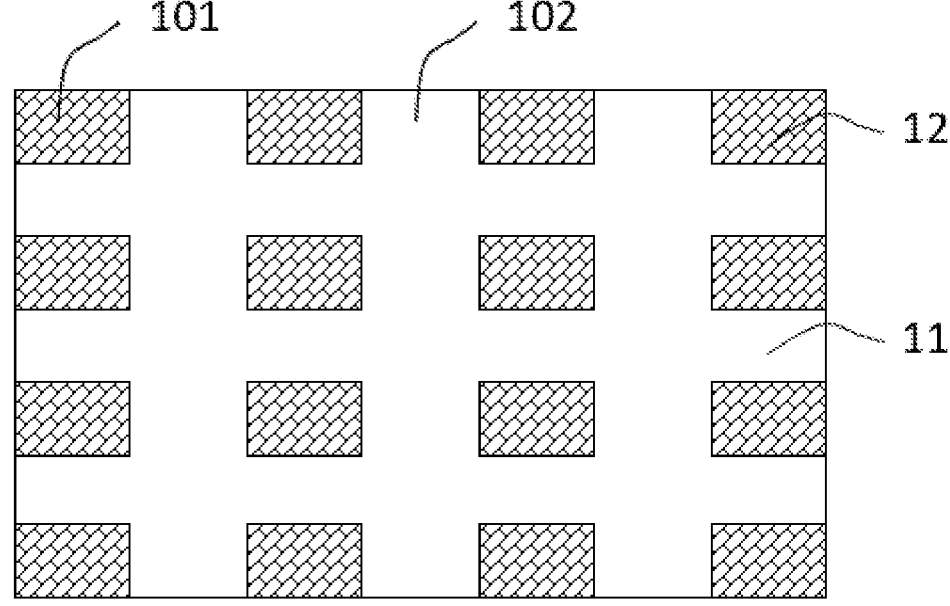
FIG. 7 is a top view of a substrate structure according to the present disclosure.

FIG. 1 is a schematic structural diagram according to the first embodiment of the present disclosure. FIG. 7 is a top view of a substrate structure according to the present disclosure. Referring to FIG. 1 and FIG. 7, this embodiment discloses an LED structure 10 including a substrate structure 1, the substrate structure 1 includes a substrate 11 and a plurality of first stress modulation layers 12 located on the substrate 11, and the plurality of first stress modulation layers 12 are arranged periodically.

A light-emitting unit 2 is located on the substrate structure 1, and the light-emitting unit 2 includes a first semiconductor layer 21, a light-emitting layer 22 and a second semiconductor layer 23 which are stacked in sequence.

The substrate structure 1 includes a first region 101 and a second region 102, the first stress modulation layer 12 is located on the first region 101, the light-emitting unit 2 located on the first region 101 and the light-emitting unit 2 located on the second region 102 have different light-emitting wavelengths.

The first stress modulation layer 12 is a Group III-V compound. Preferably, the first stress modulation structure 12 is AlN. The light-emitting layer 22 includes In element. Since a lattice constant of the first stress modulation layer 12 is smaller than a lattice constant of the light-emitting unit 2, the light-emitting unit 2 on the first region 101 has a built-in stress different from that on the second region 102, so that a content of In in the light-emitting layer 22 on the first region 101 is smaller than a content of In in the light-emitting layer 22 on the second region 102, and the corresponding light-emitting wavelength of the light-emitting layer 22 on the first region 101 is shorter than that on the second region, thereby achieving a light-emitting unit with two kinds of main light-emitting wavelengths on the same substrate.

In the embodiment of the present disclosure, a thickness of the first stress modulation layer 12 is less than 30 nm. Preferably, the thickness of the first stress modulation layer 12 is 5 to 30 nm.

The substrate 11 may include conventional semiconductor substrate materials such as Si, GaN, SiC or sapphire. In this disclosure, the substrate 11 is made of a sapphire substrate material, which is not limited.

In this embodiment, preferably, it is ensured that the first semiconductor layer 21 located on the first region 101 and the second region 102 is interconnected, so as to facilitate the subsequent simultaneous preparation of electrodes connected to the first semiconductor layer 21. In other embodiments, the first semiconductor layer 21 in the first region 101 and the second region 102 may also be isolated, and then electrodes for connecting the first semiconductor layer 21 in different regions are separately prepared, which is not limited herein.

The first semiconductor layer 21, the light-emitting layer 22 and the second semiconductor layer 23 are all Group III-V compounds. The first semiconductor layer 21, the light-emitting layer 22 and the second semiconductor layer 23 may include one or more materials of AlN, GaN, AlGaN or InGaN.

The conductivity types of the first semiconductor layer 21 and the second semiconductor layer 23 are opposite. Preferably, in the first embodiment of the present disclosure, the first semiconductor layer 21 is an N-type doped semiconductor layer, and the second semiconductor layer 23 is an P-type doped semiconductor layer.

The Second Embodiment

Figure 2:
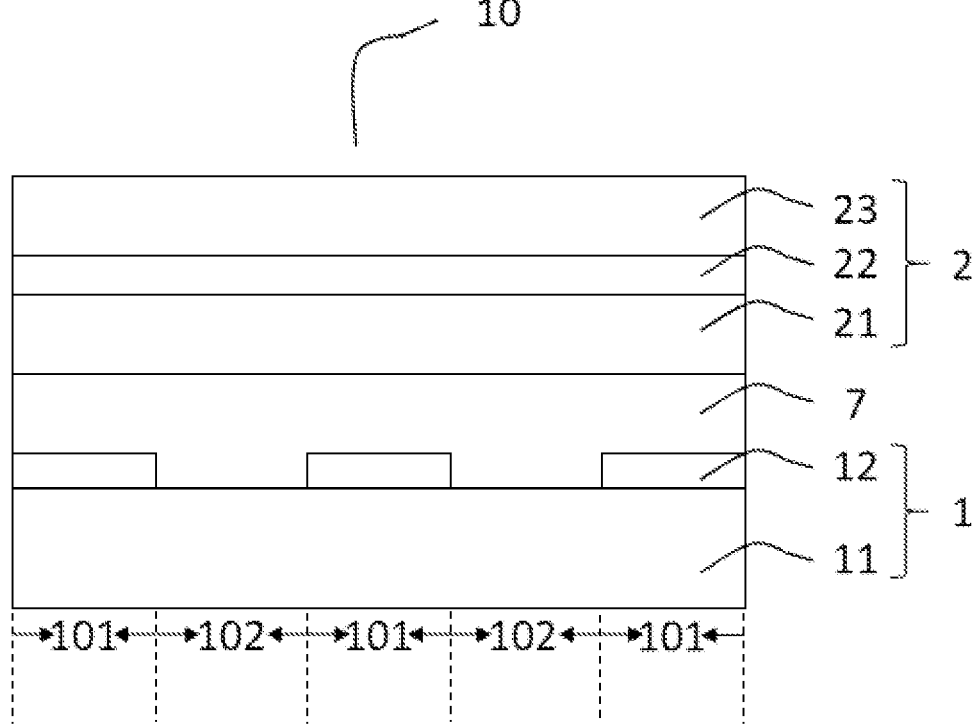
FIG. 2 is a schematic structural diagram according to a second embodiment of the present disclosure.

FIG. 2 is a schematic structural diagram according to a second embodiment of the present disclosure. Referring to FIG. 2, the structure of the second embodiment in the present disclosure is substantially the same as that of the first embodiment, and the difference includes the following:

The LED structure 10 in this embodiment further includes a buffer layer 7, the material of the buffer layer 7 may be AlN, and the buffer layer 7 is located between the substrate structure 1 and the light-emitting unit 2. The arrangement of the buffer layer 7 effectively improves the crystal quality of the light-emitting unit 2 and the light-emitting efficiency.

The Third Embodiment

Figure 3:
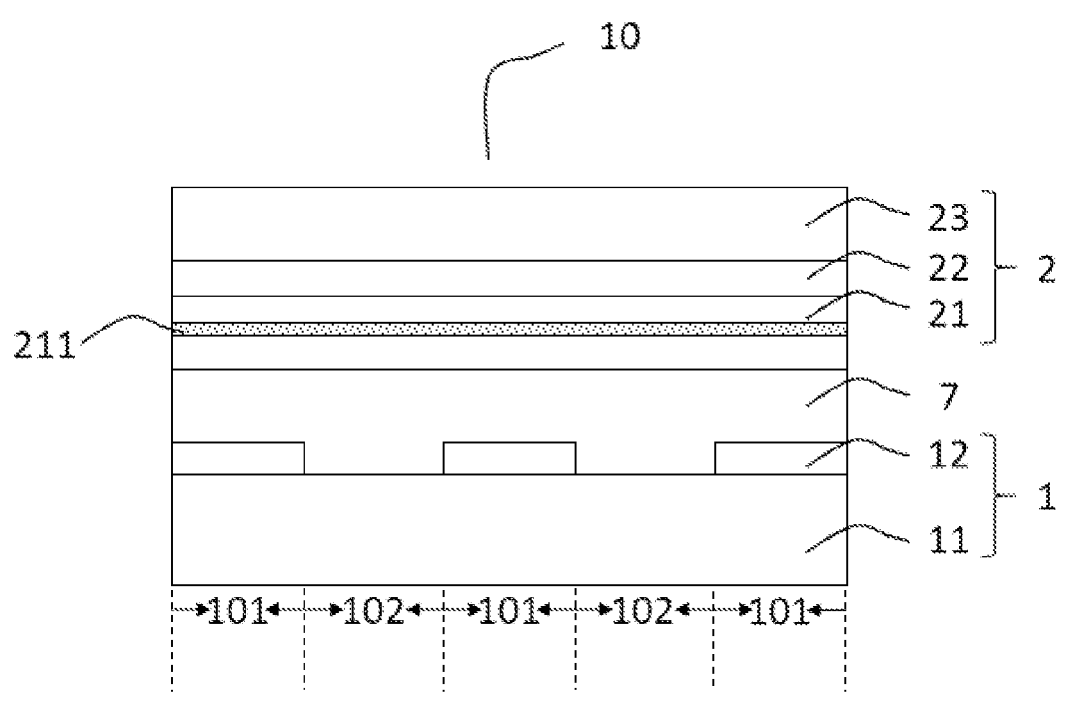
FIG. 3 is a schematic structural diagram according to a third embodiment of the present disclosure.

FIG. 3 is a schematic structural diagram according to the third embodiment of the present disclosure. Referring to FIG. 3, the structure of the third embodiment of the present disclosure is substantially the same as that of the first embodiment or the second embodiment, and the difference includes the following:

The LED structure 10 in this embodiment further includes an insertion layer 211, and the insertion layer 211 is located in the first semiconductor layer 21.

The arrangement of the insertion layer 211 further expands the difference of the built-in stress between the light-emitting unit 2 located on the first region 101 and the light-emitting unit 2 located on the second region 102, so as to enlarge the difference of the light-emitting wavelengths between the light-emitting unit 2 located on the first region 101 and the light-emitting unit 2 located on the second region 102, and further realize the light-emitting unit 2 having two main kinds of light-emitting wavelengths on the same substrate.

The material of the insertion layer 211 is a Group III-V compound. In this embodiment of the present disclosure, the material of the insertion layer 211 is AlGaN.

Preferably, the insertion layer 211 may be N-type doped. The doping element may be Si or Ge, which is not limited in the present disclosure, as long as the insertion layer 211 is formed by N-type doped.

The Fourth Embodiment

Figure 4:
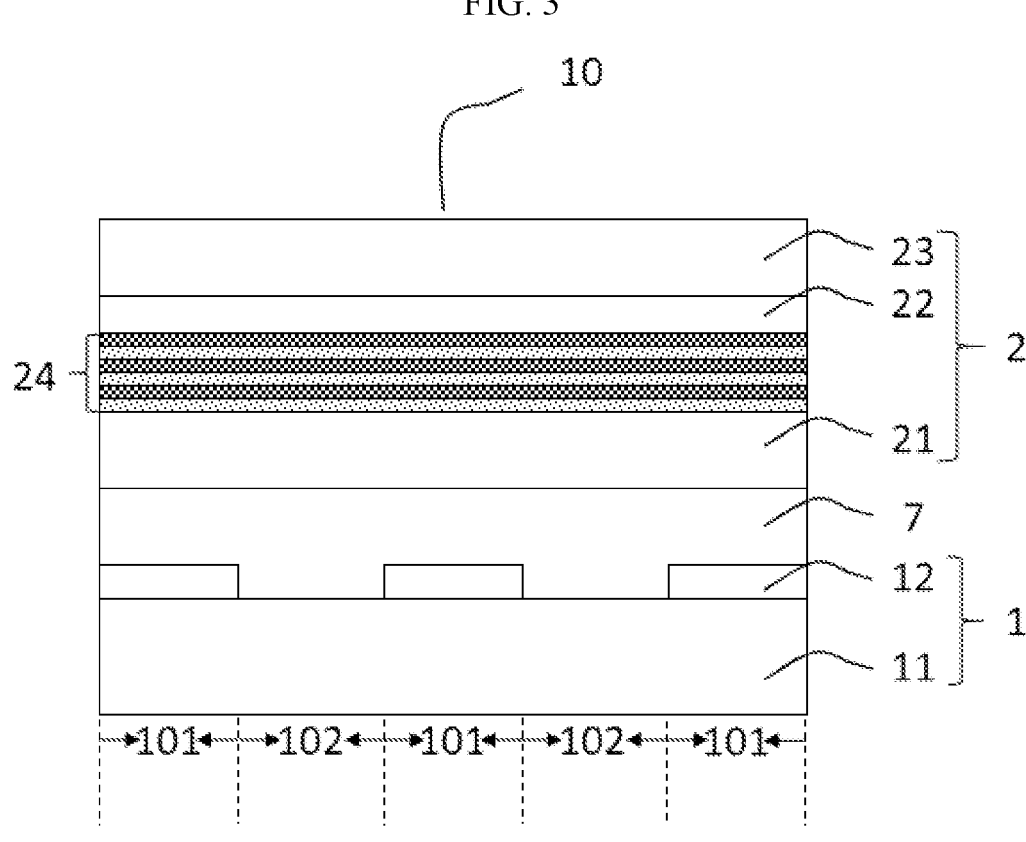
FIG. 4 is a schematic structural diagram according to a fourth embodiment of the present disclosure.

FIG. 4 is a schematic structural diagram according to the fourth embodiment of the present disclosure. Referring to FIG. 4, the structure of the fourth embodiment in the present disclosure is substantially the same as the structure of any one of the first embodiment to the third embodiment, and the difference includes the following:

The LED structure 10 in this embodiment further includes a second stress modulation layer 24, and the second stress modulation layer 24 is located between the first semiconductor layer 21 and the light-emitting layer 22.

The second stress modulation layer 24 is a superlattice structure comprising a Group III-V compound material. In this embodiment, the minimum repeating unit of the superlattice structure in the second stress modulation layer 24 may be a combination of InGaN and GaN or a combination of AlGaN and GaN.

The arrangement of the second stress modulation layer 24 further expands the difference of the built-in stress between the light-emitting unit 2 located on the first region 101 and the light-emitting unit 2 located on the second region 102, so as to enlarge the difference of the light-emitting wavelengths between the light-emitting unit 2 located on the first region 101 and the light-emitting unit 2 located on the second region 102. Therefore, the light-emitting unit 2 having two kinds of main light-emitting wavelengths on the same substrate is further realize.

The Fifth Embodiment

Figure 5:
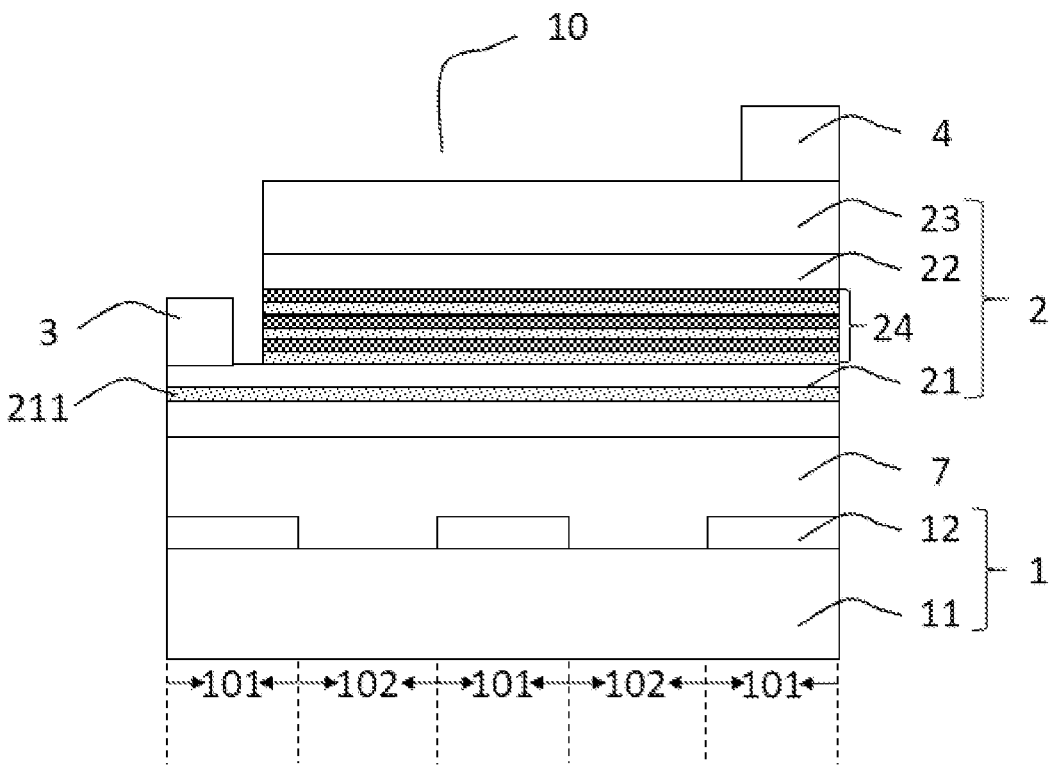
FIG. 5 is a schematic structural diagram according to a fifth embodiment of the present disclosure.

FIG. 5 is a schematic structural diagram according to the fifth embodiment of the present disclosure. Referring to FIG. 5, the structure of the fifth embodiment in the present disclosure is substantially the same as the structure of any one of the first embodiment to the fourth embodiment, and the difference includes the following:

The LED structure 10 in this embodiment further includes a first electrode 3 and a second electrode 4. The first electrode 3 is electrically connected to the first semiconductor layer 21, and the second electrode 4 is electrically connected to the second semiconductor layer 23. Further, the first electrode 3 and the second electrode 4 can be provided on the first region 101 and the second region 102 respectively to adjust the current density in different regions, and further to adjust the luminous efficiency of the LED structure 10 in different regions.

The Sixth Embodiment

Figure 6:
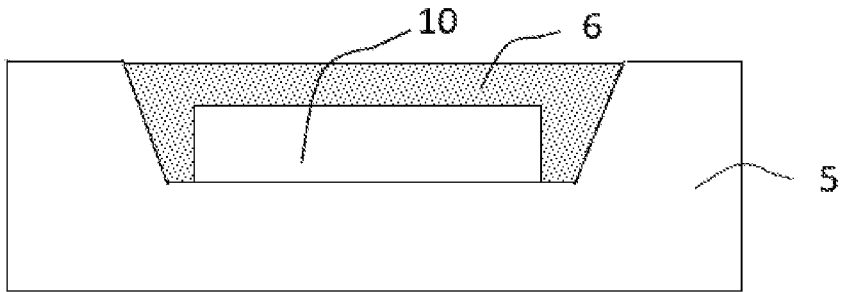
FIG. 6 is a schematic structural diagram according to a sixth embodiment of the present disclosure.

FIG. 6 is a schematic structural diagram according to the sixth embodiment of the present disclosure. Referring to FIG. 6, the sixth embodiment discloses an LED device, including the LED structure 10 disclosed in any one of the first embodiment to the fifth embodiment.

The LED device of this embodiment in the present disclosure further includes an encapsulation substrate 5 and an encapsulation adhesive 6. The encapsulation substrate 5 is located on a side of the substrate structure 1 away from the light-emitting unit 2. The encapsulation adhesive 6 covers the upper surface and sidewalls of the LED structure 10, and the encapsulation adhesive 6 includes silica gel and scattered phosphor materials.

Preferably, in the LED structure 10, the light emitted by the light-emitting unit 2 located on the first region 101 is blue light, the light emitted by the light-emitting unit 2 located on the second region 102 is green light, and the phosphor material in the encapsulation adhesive 6 is a red light phosphor material. A part of the green light emitted by the light-emitting unit 2 located on the second region 102 and a part of the blue light emitted by the light-emitting unit 2 located on the first region 101 excite the red light phosphor to emit red light, and the generated red light and the blue and green light that have not been converted by the red light phosphor are synthesized into white light. The LED device of this structure effectively solves the problem of low color gamut of the traditional LED backlight chip, simplifies the manufacturing steps of the LED backlight chip, and reduces the manufacturing cost of the LED backlight chip.

As a preferred embodiment, in this embodiment, the width of the LED structure 10 is less than 100 μm, more preferably 20 to 100 μm. The width of the first stress modulation layer 12 is less than 50 μm, more preferably 20 to 50 μm.

The Seventh Embodiment

Figure 8:
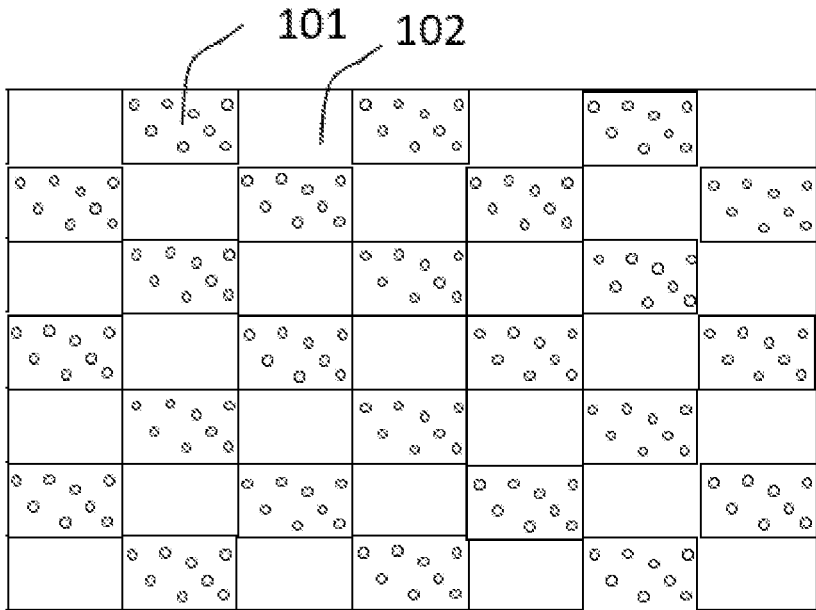
FIG. 8 is a top view of embodiment 7 of the present disclosure.
Figure 9:
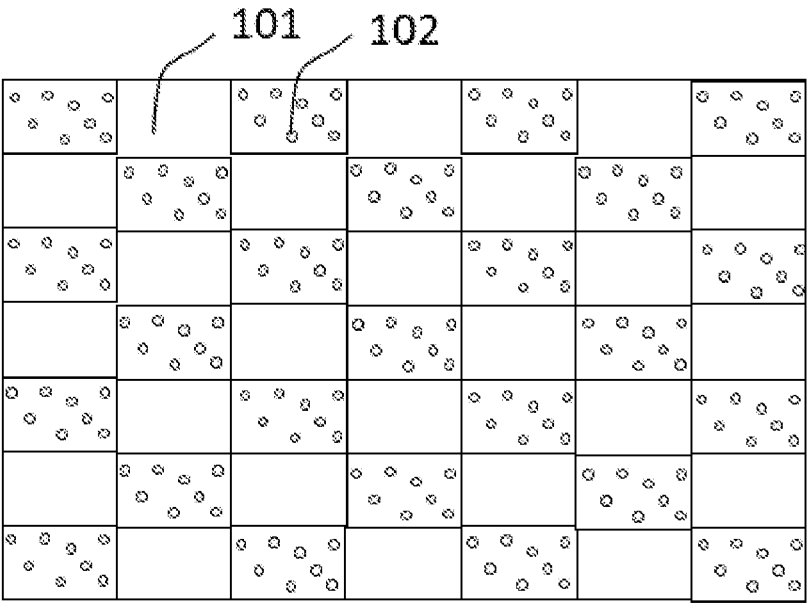
FIG. 9 is another top view of embodiment 7 of the present disclosure.

FIG. 8 and FIG. 9 are schematic structural diagrams according to the seventh embodiment of the present disclosure. Referring to FIG. 8 and FIG. 9, the seventh embodiment in the present disclosure includes the LED structure 10 disclosed in any one of the first embodiment to the fifth embodiment. The structure of the LED device in the seventh embodiment of the present disclosure and the LED device in the sixth embodiment are substantially the same, and the difference includes the following.

The arrangement of the phosphor materials in the encapsulation adhesive 6 corresponding to different regions are different. In this embodiment, the red light phosphor material is provided only in the encapsulation adhesive 6 corresponding to the first region 101 or only in the encapsulation adhesive 6 corresponding to the second region 102. Further, in one implementation of this embodiment, as shown in FIG. 8, a red light phosphor material is provided in at least a partial region of the encapsulation adhesive 6 corresponding to the first region 101 emitting blue light, and no phosphor material is provided in the encapsulation adhesive 6 corresponding to the second region 102 emitting green light. Preferably, scattered red light phosphors are provided in all regions of the encapsulation adhesive 6 corresponding to the first region 102. In other implementation of this embodiment, as shown in FIG. 9, the encapsulation adhesive 6 corresponding to the first region 101 which emits blue light does not contain phosphor material, and the encapsulation adhesive 6 corresponding to the second region 102 which emits green light is provided with red light phosphors in at least a partial of the region. Preferably, scattered red light phosphors are provided in all regions of the encapsulation adhesive 6 corresponding to the second region 102. In this way, the red light phosphor material can be excited by only one wavelength of light to emit red light, avoiding the interference of another wavelength of light on the excited red light phosphor, so that the ratio of the light emitting efficiency of blue light, green light and red light can be easily adjusted, and then the green light emitted by the first region 101, the blue light emitted by the second region 102 and the red light emitted by the excited red light phosphor can be synthesized into white light. The LED device of this structure effectively solves the problem of low color gamut of the traditional LED backlight chip, simplifies the manufacturing steps of the LED backlight chip, and reduces the manufacturing cost of the LED backlight chip.

It is difficult to realize light-emitting units with two kinds of main light-emitting wavelengths on the same substrate in the related art, which needs to be realized by transferring light-emitting units with different light-emitting wavelengths to the same substrate, this method is relatively complicated, and the production cost of this method is high. In this embodiment, an LED structure which emits blue light wavelength and green light wavelength at the same time, and red light phosphors are added to realize a white light LED with high color rendering index, and to reduce the manufacturing cost of LED backlight chips.

The Eighth Embodiment

Figure 10:
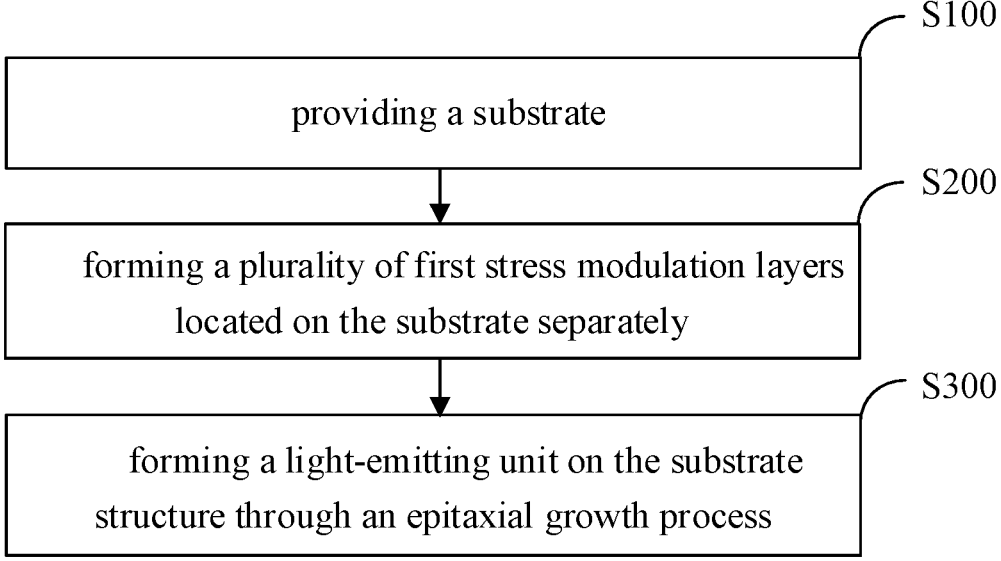
FIG. 10 is a schematic flowchart of a manufacturing method for an LED structure according to an eighth embodiment of the present disclosure.

FIG. 10 is a schematic flowchart of a manufacturing method for an LED structure according to the eighth embodiment of the present disclosure. Referring to FIG. 10, the eighth embodiment in the present disclosure discloses a manufacturing method for an LED structure, and the method includes the following steps:

Step S100: providing a substrate 11.

Step S200: forming a plurality of first stress modulation layers 12 located on the substrate 11 separately to form a substrate structure 1 comprising a substrate 11 and a plurality of first stress modulation layers 12 located on the substrate 11 separately.

Step S300: forming a light-emitting unit 2 on the substrate structure 1 by an epitaxial growth process.

The substrate structure 1 includes a first region 101 of which upper surface is the first stress modulation layer 12 and a second region 102 of which upper surface is the substrate 11, and the light-emitting unit 2 formed on the first region 101 and the light-emitting unit 2 formed on the second region 102 have different light-emitting wavelengths.

Specifically, firstly, the first semiconductor layer 21 is epitaxially grown on the substrate structure 1, then the light-emitting layer 22 is epitaxially grown on the first semiconductor layer 21, and finally the second semiconductor layer 23 is epitaxially grown on the light-emitting layer 22. Since the first stress modulation layer 12 is provided in the second region 102, the materials of the first stress modulation layer 12 and the substrate 11 are different, and the lattice constants are also different, so that the internal structures (for example, a number of defects) of the first semiconductor layer 21 epitaxially grown on the first region 101 and the second region 102 of the substrate structure 1 are different.

In this embodiment, by arranging the first stress modulation layer on the substrate, the light-emitting unit epitaxially grown on the second region where the first stress modulation layer is provided and the light-emitting unit epitaxially grown on the first region where the first stress modulation layer is not provided respectively have different built-in stress, different number of defects, and different In element content, so that the light-emitting unit epitaxially grown on the first region and the light-emitting unit epitaxially grown on the second region have different conduction bands and different valence bands respectively, and the emission wavelengths of the light-emitting unit epitaxially grown on the first region and the light-emitting unit epitaxially grown on the second region formed by the same process are different. The technical problem of the low color gamut of the LED structure can be solved without increasing the production cost.

The above descriptions are only preferred embodiments of the present disclosure, and do not limit the present disclosure in any form. Although the present disclosure has been disclosed as above in preferred embodiments, it is not intended to limit the present disclosure. Those who has skill in the art, without departing from the scope of the technical solutions of the present disclosure, can make some changes or modifications by using the technical contents disclosed above to equivalent embodiments of equivalent changes. However, any simple modifications, equivalent changes and modifications made to the above embodiments according to the technical essence of the present disclosure without departing from the content of the technical solutions of the present disclosure still fall within the scope of the technical solutions of the present disclosure.

What is claimed is:

1. A light-emitting diode (LED) structure, comprising:
   a substrate structure, the substrate structure comprising a substrate and a plurality of first stress modulation layers located on the substrate separately from each other; and
   a light-emitting unit located on the substrate structure;
   wherein the substrate structure comprises a first region of which upper surface is the first stress modulation layer and a second region of which upper surface is the substrate, and a light-emitting unit located on the first region and a light-emitting unit located on the second region have different light-emitting wavelengths.

2. The LED structure according to claim 1, wherein a marital of the plurality of first stress modulation layer is a Group I-V compound, and a lattice constant of the plurality of first stress modulation layer is smaller than a lattice constant of the light-emitting unit.

3. The LED structure according to claim 1, wherein the light-emitting unit comprises In element, and a content of In in the light-emitting unit located on the first region is smaller than a content of In in the light-emitting unit located on the second region.

4. The LED structure according to claim 1, wherein the plurality of first stress modulation layers are arranged periodically.

5. The LED structure according to claim 1, wherein the light-emitting unit comprises a first semiconductor layer, a light-emitting layer and a second semiconductor layer which are stacked in sequence.

6. The LED structure according to claim 5, wherein an insertion layer is provided in the first semiconductor layer, and a conductivity type of the insertion layer is the same as a conductivity type of the first semiconductor layer.

7. The LED structure according to claim 5, wherein the LED structure further comprises a second stress modulation layer, and the second stress modulation layer is located between the first semiconductor layer and the light-emitting layer.

8. The LED structure according to claim 7, wherein the second stress modulation layer has a superlattice structure comprising a Group II-V compound material.

9. The LED structure according to claim 1, wherein a thickness of the first stress modulation layer is less than 30 nm.

10. The LED structure according to claim 1, wherein the LED structure further comprises:

a first electrode, electrically connected to the first semi-conductor layer; and a second electrode, electrically connected to the second semiconductor layer.

11. The LED structure according to claim 1, wherein the first region and the second region are arranged periodically and alternately.

12. The LED structure according to claim 1, wherein the light-emitting unit is formed on the substrate structure by means of epitaxial growth.

13. The LED structure according to claim 1, wherein the materials of the first stress modulation layer and the substrate are different, so that the light-emitting unit formed on the first region and the light-emitting unit formed on the second region by the same process have different light-emitting wavelengths.

14. An LED device, comprising:

the LED structure according to claim 1;

a package substrate located on a side of the substrate structure away from the light-emitting unit;

an encapsulation adhesive, the encapsulation adhesive covering an upper surface and side walls of the LED structure, and the encapsulation adhesive comprising a phosphor material.

15. The LED device according to claim 14, wherein a width of the LED structure is less than 100 pm.

16. The LED device according to claim 14, wherein a width of the first stress modulation layer is less than 50 μm.

17. The LED device according to claim 14, wherein in the LED structure, light emitted by the light-emitting unit located on a first region is blue light, and light emitted by the light-emitting unit located on a second region is green light; and red light phosphors are provided in at least a partial of the encapsulation adhesive.

18. The LED device according to claim 14, wherein the encapsulation adhesive above the first region does not contain a phosphor material, and the encapsulation adhesive above at least a partial of the second region is provided with red light phosphors.

19. The LED device according to claim 14, wherein the encapsulation adhesive above the second region does not contain a phosphor material, and the encapsulation adhesive above at least a partial of the first region is provided with red light phosphors.

20. A manufacturing method for an LED structure, comprising:

providing a substrate;

forming a plurality of first stress modulation layers located on the substrate separately to form a substrate structure comprising a substrate and a plurality of first stress modulation layers located on the substrate separately; and forming a light-emitting unit on the substrate structure by an epitaxial growth process;

wherein the substrate structure comprises a first region of which upper surface is the first stress modulation layer and a second region of which upper surface is the substrate, and a light-emitting unit formed on the first region and a light-emitting unit formed on the second region have different light-emitting wavelengths.

* * * * *